(12) United States Patent
Christenson

(10) Patent No.: US 12,264,063 B2
(45) Date of Patent: Apr. 1, 2025

(54) THREE-DIMENSIONAL STRESS-SENSITIVE DEVICE

(71) Applicant: Rosemount Aerospace Inc., Burnsville, MN (US)

(72) Inventor: John C. Christenson, Prior Lake, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 287 days.

(21) Appl. No.: 17/726,935

(22) Filed: Apr. 22, 2022

(65) Prior Publication Data

US 2023/0339741 A1   Oct. 26, 2023

(51) Int. Cl.

| | |
|---|---|
| G01N 1/14 | (2006.01) |
| B81B 3/00 | (2006.01) |
| B81C 1/00 | (2006.01) |
| G01L 1/14 | (2006.01) |
| G01L 1/18 | (2006.01) |
| H10N 30/30 | (2023.01) |

(52) U.S. Cl.
CPC ........ B81B 3/0021 (2013.01); B81C 1/00269 (2013.01); G01L 1/142 (2013.01); G01L 1/18 (2013.01); H10N 30/302 (2023.02); *B81B 2203/019* (2013.01)

(58) Field of Classification Search
CPC ............ B81B 3/0021; B81B 2203/019; B81C 1/00269; G01L 1/142; G01L 1/18; G01L 9/0047; G01L 9/0054; G01L 9/0041; G01L 7/02; G01L 7/022; G01L 12/142; H10N 30/302

USPC ........ 73/768, 786, 715–727, 514.01, 514.36, 73/514.37, 514.32–514.34, 862.043, 73/862.044

See application file for complete search history.

(56) References Cited

U.S. PATENT DOCUMENTS

| | | | | |
|---|---|---|---|---|
| 5,343,765 | A | * | 9/1994 | Okada ..................... G01L 5/165 73/862.043 |
| 6,395,574 | B2 | | 5/2002 | Benzel et al. |
| 7,137,302 | B2 | | 11/2006 | Silverbrook et al. |

(Continued)

FOREIGN PATENT DOCUMENTS

| | | | | |
|---|---|---|---|---|
| CN | 106461481 A | * | 2/2017 | ........... G01L 13/025 |
| JP | 4073199 B2 | * | 4/2008 | ........... G01L 1/2287 |

OTHER PUBLICATIONS

Extended European Search Report for EP Application No. 23167828. 5, dated Sep. 15, 2023, 7 pages.

*Primary Examiner* — Robert R Raevis
(74) *Attorney, Agent, or Firm* — Kinney & Lange, P.A.

(57) ABSTRACT

A stress-sensitive device includes a substrate having a first surface with a cavity defined therein and a three-dimensional deformable material extending along the first surface and into the cavity. The three-dimensional deformable material has an electrical characteristic responsive to deformation. A method of forming a three-dimensional stress-sensitive device includes providing a substrate having a first surface and a second surface opposite the first surface, forming a cavity in the substrate, wherein the cavity is open to the first surface, depositing a sacrificial layer in the cavity, depositing a deformable material on the sacrificial layer, and removing at least a portion of the sacrificial layer to form an interstitial space between the deformable material and the substrate in the cavity.

11 Claims, 10 Drawing Sheets

(56) References Cited

U.S. PATENT DOCUMENTS

| | | |
|---|---|---|
| 9,073,749 B2 | 7/2015 | Graham et al. |
| 9,534,972 B2 | 1/2017 | Eichhorn et al. |
| 9,670,057 B1 | 6/2017 | Oldsen |

\* cited by examiner

THREE-DIMENSIONAL STRESS-SENSITIVE DEVICE

BACKGROUND

The present disclosure relates generally to integrated circuitry and microelectromechanical systems (MEMS) devices and more specifically to stress-sensitive devices and methods of manufacture.

Conventional stress-sensitive pressure sensing devices, such as piezoresistive pressure sensors, are made by forming a resistor or set of resistors comprised of a planar piezoresistive material over the edge(s) of a deformable membrane suspended over a cavity. These devices require large surface areas on their substrate. The highest stress, and thus highest strain (deformation), occurs at the center of a long edge of the deformable membrane and the piezoresistors are advantageously placed over these portions of the deformable membrane that have the highest stress to provide the highest sensitivity. Surface planar piezoresistive devices of the prior art have only one set of edges that can deform, which limits the number and size of resistors that can be placed over that set of edges. Additionally, pressure sensors of the prior art typically are sensitive to the stresses placed on the device by its packaging. Some stress-relieving mitigations that may be needed to alleviate the packaging stresses include mounting the die on a pedestal, cantilevering the device away from the package, and the like. These mitigation techniques can complicate the device and the package and increase the cost of the assembled unit. Further, many stress-sensitive pressure sensing devices stand proud above a substrate surface where they can be susceptible to damage. Finally, the z-axis height of sacrificial films over which a device layer can be formed is typically limited by practical concerns such as stress in the film and practical thickness of the film during deposition or film growth and stiction remains a challenge in manufacturing.

A need exists for stress-sensitive devices that are less susceptible to damage, packaging stresses, and manufacturing constraints, and that provide improved operability without consuming any additional valuable space on a surface of a substrate.

SUMMARY

In one aspect, a stress-sensitive device includes a substrate having a first surface with a cavity defined therein and a three-dimensional deformable material extending along the first surface and into the cavity. The three-dimensional deformable material has an electrical characteristic responsive to deformation.

In another aspect, a method of forming a three-dimensional stress-sensitive device includes providing a substrate having a first surface and a second surface opposite the first surface, forming a cavity in the substrate, wherein the cavity is open to the first surface, depositing a sacrificial layer in the cavity, depositing a deformable material on the sacrificial layer, and removing at least a portion of the sacrificial layer to form an interstitial space between the deformable material and the substrate in the cavity.

The present summary is provided only by way of example, and not limitation. Other aspects of the present disclosure will be appreciated in view of the entirety of the present disclosure, including the entire text, claims and accompanying figures.

Figure 1:
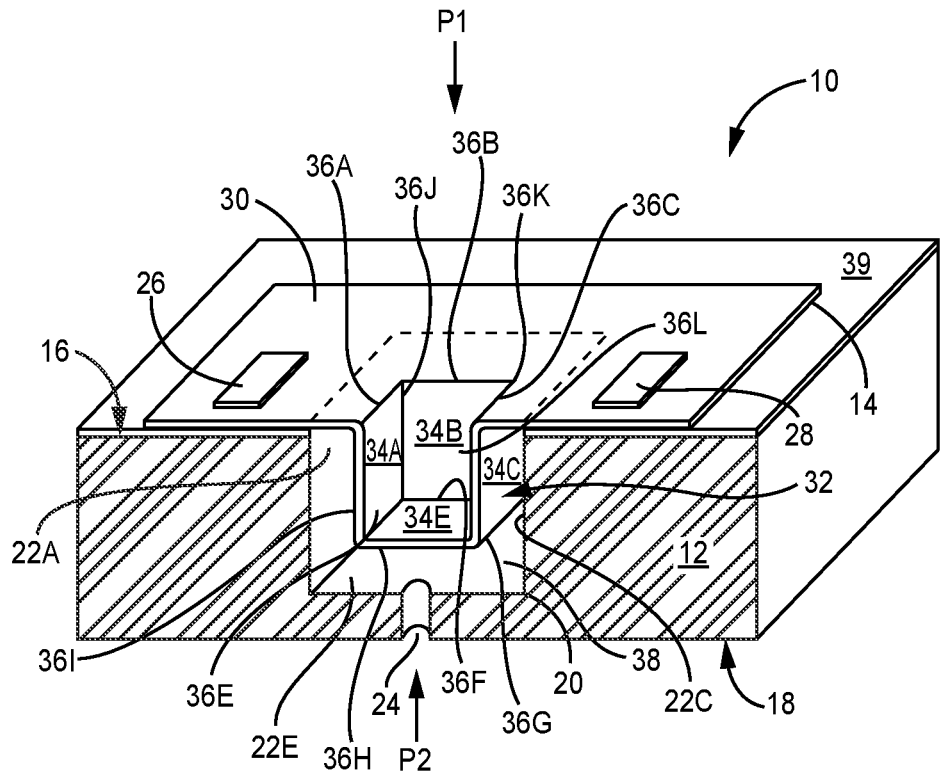
FIG. 1 is a cross-section of an isometric view of a stress-sensitive device having a three-dimensional deformable structure.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

The present disclosure is directed to three-dimensional stress-sensitive devices and method of manufacture, which overcome the challenges of the prior art stress-sensitive devices. Unlike the planar moveable membrane used in stress-sensitive devices of the prior art, the three-dimensional structure described herein provides multiple edges and/or surfaces which may deform or flex under an applied pressure. As such, a stress-sensitive (e.g., piezoresistive material) can experience more deformation (strain) than a two-dimensional structure of the prior art and can thereby provide a larger output signal compared to a planar, two-dimensional, device for any given applied pressure. In some embodiments, the three-dimensional deformable structure can provide an improved signal strength for a reduced substrate surface area as compared to prior art devices thereby allowing for more devices to be produced on a single substrate. A three-dimensional stress-sensitive structure can be suspended from a surface of the substrate and extend into a substrate depression or subsurface cavity. The subsurface suspension of the three-dimensional stress-sensitive structures may reduce susceptibility to external stresses, such as those applied to the device from packaging, processing, and handling, and can allow freedom in selecting die attach methods, which can reduce the complexity of packaging. As described further herein, the three-dimensional stress-sensitive structures can be suitable for the manufacture of, for example, piezoresistive pressure sensors, capacitance pressure sensors, and Physically Unclonable Function (PUF) devices. Depending on the configuration and device packaging, the three-dimensional stress-sensitive devices of the present disclosure can be used to measure absolute, gauge, or differential pressure.

As described further herein, the manufacture of the disclosed three-dimensional stress-sensitive devices can employ planar processing techniques known in the integrated circuit (IC) and MEMS industries, allowing for simple and inexpensive manufacturing. The described three-dimensional stress-sensitive devices can be formed simultaneously with or after the regular and necessary processing of an IC or MEMS device.

It will be understood by one of ordinary skill in the art that the disclosed three-dimensional stress-sensitive devices can be designed with different operating ranges. Further, the present disclosure contemplates variations in design parameters including, but not limited to, substrate depression depth, area, and methods of forming substrate depressions or subsurface cavities; selection of structural materials, including piezoresistive or other stress-sensitive materials, doping characteristics, dielectric materials, conductive materials, and the like; selection of insulator material(s); section of sacrificial material(s); selection of other materials, including, but not limited to, seals and packaging materials; and material dimensions including, but not limited to, thicknesses, lengths, areas, and separation distances.

As disclosed herein, the three-dimensional stress-sensitive devices, pressure cavity or cavities in which they are formed, and gaps or interstitial space formed therebetween can have any number of shapes or three-dimensional geometries. Furthermore, any number of three-dimensional stress-sensitive devices or structures can be formed in a single substrate in a variety of advantageous arrangements. In some embodiments, an array of three-dimensional stress-sensitive devices can be used to further amplify an output signal. Arrays of three-dimensional stress-sensitive devices can be disposed in multiple cavities. Each cavity can include one or more ports, which can be open to an external pressure or can be sealed to maintain a set pressure.

Figure 2:
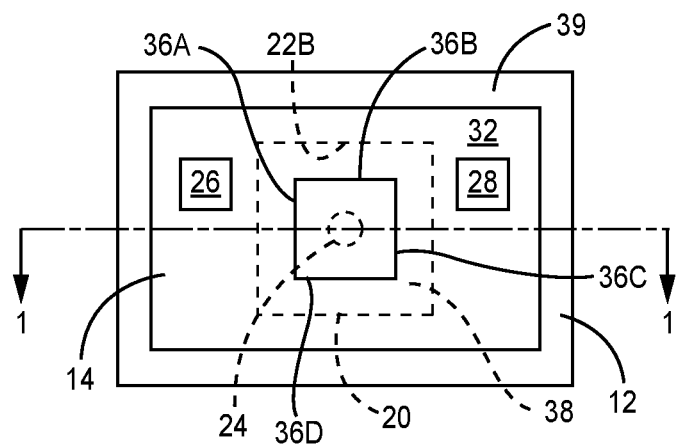
FIG. 2 is a top view of the stress-sensitive device of FIG. 1

FIG. 1 is a cross-section of an isometric view of a stress-sensitive device having a three-dimensional deformable structure. FIG. 2 is a top view of the stress-sensitive device of FIG. 1. FIG. 1 shows stress-sensitive device 10, substrate 12, and three-dimensional deformable structure 14. Substrate 12 includes oppositely disposed top and bottoms surfaces 16 and 18, cavity 20 defined by cavity walls 22A-22E, and port 24. Three-dimensional deformable structure 14 includes input pad 26, output pad 28, planar portion 30, and three-dimensional portion 32 defined by deformable walls 34A-34E, and deformable edges 36A-36L. Three-dimensional portion 32 is separated from cavity walls 22 by interstitial space 38. Planar portion 30 can be disposed on an insulating layer 39. As described further herein, in some embodiments, insulating layer 39 can also line cavity walls 22A-22E. FIG. 1 additionally shows external pressures P1 and P2 applied to three-dimensional deformable structure 14. FIG. 2 shows substrate 12, three-dimensional deformable structure 14, cavity 20, port 24, edges 36A-36D, input pad 26, and output pad 28.

Stress-sensitive device 10 can be a gauge or differential pressure sensor used to measure pressure P1 with reference to atmospheric pressure P2, or a difference between variable external pressures P1 and P2. In alternative embodiments, P1 can be atmospheric pressure and P2 can be an external variable pressure. Both a cavity defined by deformable walls 34 and open to substrate surface 16 and interstitial space 38 are subjected to variable and/or atmospheric pressures exerted by P1 and P2, which can cause deformable walls 34A-34D and deformable edges 36A-36L to flex or deform (strain) in response. Three-dimensional deformable structure 14 can be formed of a material having an electrical characteristic responsive to deformation or strain. A bias can be applied across electrical input and output pads 26, 28 and the resulting structure can be used to measure a change in resistance due to deformation of the three-dimensional deformable structure.

Substrate 12 can be a silicon wafer (e.g., single-crystal silicon), as known in the art, or other known semiconductor or non-semiconductor material, including but not limited to Pyrex, oxide, glass, sapphire, and III-V semiconductors. Substrate 12 can be of any known thickness. Substrate 12 has oppositely disposed top and bottom surfaces 16 and 18 upon which one or more IC or MEMS devices or additional substrates can be provided. Cavity 20 is defined in substrate 12 and is open to surface 16. Cavity 20 can extend a partial depth of substrate 12 (e.g., depression in top substrate surface 16). As illustrated in FIG. 1, cavity 12 can have an open cubic shape defined by four side walls 22A, 22B, 22C (22D not shown) and a bottom wall 22E. Cavity walls 22A-22E can be planar. Cavity walls 22A-22E can be formed by etching as described further herein. A depth of cavity 20 can vary depending on a thickness of substrate 12. In some embodiments, cavity 20 can have a depth ranging from fractions of a micron to nearly a thickness of substrate 12 (e.g., up to ¼-inch thick silicon wafer).

Insulating layer 39 can be disposed on one or both substrate surfaces 16 and 18. Insulating layer 39 can be an electrically insulating film or a combination of insulating films as known in the art. For example, insulating layer(s) 39 can be a silicon oxide or silicon nitride. In some embodiments, insulating layer 39 can line cavity walls 22A-22E.

For capacitive pressure sensors, cavity walls 22A-22E can be additionally or alternatively doped or lined with a conductive material (not shown) as described further herein to form a second plate of a capacitor.

Port 24 can extend from bottom substrate surface 18 through a partial thickness of substrate 12 to cavity 20 and, more specifically, to interstitial space 38. As illustrated in FIG. 2, port 24 can be centrally located in bottom wall 22E of cavity 20. Port 24 can have a cross-sectional area smaller than a cross-sectional area of cavity 20. Generally, the cross-sectional area of port 24 can be sized as needed to remove a sacrificial material layer and to apply external pressure P2. In other embodiments, one or more ports 24 can be formed in substrate 12 and open to cavity 20 and interstitial space 38 and can be provided in any configuration or arrangement. As described further herein, one or more ports 24 can be formed via etching and can be formed from either of top surface 16 or bottom surface 18. As discussed further herein, port 24 can be formed in the manufacturing process to provide access to a sacrificial layer disposed between three-dimensional deformable structure 14 and cavity walls 22A-22E. Port 24 can have any known shape limited only by manufacturing techniques. As illustrated in FIGS. 1 and 2, port 24 has a substantially cylindrical shape.

Three-dimensional deformable structure 14 can be a piezoresistive material such as intrinsic or doped polysilicon as known in the art. The piezoresistive material can be doped in-situ during its deposition or via implant doping or any other known doping method to optimize the resistivity and or the physical properties of the material (i.e., change stress in the structure from compressive to neutral to tensile depending on the processing conditions). The piezoresistive material can be doped with any known dopants including, but not limited to, boron and phosphorus for polysilicon. Other known piezoresistive materials and dopants are contemplated and fall within the scope of the present disclosure.

As described further herein, in some embodiments, three-dimensional deformable structure 14 can be a conductive material disposed to form a first plate of a capacitor. Cavity walls 22A-22E can be lined with a conductive material to form a second plate of the capacitor. Interstitial space 38 between cavity walls 22A-22E and three-dimensional deformable structure 14 can function as an insulating layer between the first and second plates.

Three-dimensional deformable structure 14 includes a two-dimensional planar portion 30 and three-dimensional portion 32. Planar portion 30 is disposed across top substrate surface 16. Planar portion 30 can be disposed on insulating layer 39 disposed on substrate surface 16 such that planar portion 30 is not in direct contact with substrate 12. Planar portion 30 can extend to cover substrate surface 16 fully surrounding cavity 20. As best illustrated in FIG. 2, planar portion 30 can have a rectangular shape centered around cavity 20. Planar portion 30 can extend over edges of cavity 20 defined by cavity walls 22A-22D such that a portion of planar portion 30 overhangs cavity 20. In alternative embodiments, planar portion 30 can extend to overhang only a portion of cavity 20. For example, strips of planar portion 30 can extend on either side of cavity 20, overhanging oppositely disposed cavity walls 22A and 22C or 22B and 22D.

Input pad 26 and output pad 28 can be disposed on planar portion 30 on opposite sides of cavity 20. In this manner, stress-sensitive device 10 provides two parallel resistors-one path of resistance between input pad 26 and output pad 28 that effectively extends around cavity 20 across planar portion 30 and one path of resistance between input pad 26 and output pad 28 that extends across and through cavity 20 via planar portion 30 and three-dimensional portion 32. An external pressure P1/P2 causing three-dimensional deformable structure 14 to flex or deform in any direction will cause a measurable change in resistance. The resistance between input pad 26 and output pad 28 across the top of substrate 12 (planar portion 30 alone) will not change, but the resistance as a whole will change in value due to the deflection of three-dimensional portion 32 in cavity 20 and at edges 36A-36D joining planar portion 30.

Three-dimensional portion 32 can have a cubic shape, as illustrated in FIG. 1, matching a shape of cavity 20. Three-dimensional portion 32 is defined by four deformable side walls 34A, 34B, 34C, and 34D (not shown) and bottom wall 34E. Adjacent deformable walls 34A-34E are connected by deformable side edges 361-36L. Side deformable walls 34A-34D are additionally connected to planar portion 30 via deformable edges 36A-36D and to deformable bottom wall 34E by deformable edges 36E-36H. Three-dimensional portion 32 forms a variable volume cavity open to substrate surface 16. Each of deformable walls 34A-34E and deformable edges 36A-36L can flex or deform as an external pressure is applied via P1 and/or P2, which can change the shape of three-dimensional portion 32 and cavities defined thereby (i.e., variable volume cavity open to substrate surface 16 and interstitial space 38). For example, a greater pressure P1 can cause deformable walls 34A-34E and/or deformable edges 36A-36L to bow outward toward cavity walls 22A-22E, thereby reducing an area of interstitial space 38 and volume expansion of the cavity defined by deformable walls 34A-34E and open to substrate surface 16. Alternatively, a greater pressure P2 can cause a volume contraction of three-dimensional portion 32 or inward bowing of deformable walls 34A-34E and/or deformable edges 36A-36L. Deformation of three-dimensional deformable structure 14 caused by the application of an external pressure causes the piezoresistive material to change resistance in proportion to the applied pressure. In the cubic structure of FIG. 1, all 12 edges 36A-36L and all five deformable walls 34A-34E can flex and contribute to the output of stress-sensitive device 10, which is a significant improvement over the prior art. The volume expansion and contraction capability of the present disclosure is a further distinguishing feature over the planar deformation of the prior art and in addition to the deformation of multiple walls 34A-34E and edges 36A-36L, can provide significantly more strain in the device than a conventional device, resulting in a larger signal for any given applied pressure. For capacitance sensors, the capacitance between three-dimensional portion 32 and cavity walls 22A-22E changes. When external pressure P2 is greater than external pressure P1, three-dimensional portion 32 contracts, increasing a capacitive gap (distance dimension of interstitial space 38 between three-dimensional portions 32 and cavity walls 22A-22E), and the capacitance is decreased. Conversely, when external pressure P2 is less than external pressure P1, three-dimensional portion 32 expands, decreasing the capacitive gap and thus increasing capacitance. Both positive and negative pressure can be measured with respect to a defined standard state and both magnitude of the pressure and the sign of the pressure may be known.

As discussed further herein, three-dimensional portion 32 is not limited to the cubic shape of FIG. 1. Multiple geometric shapes including rectangular box, hemisphere, pyramidal, truncated pyramidal, cylindrical, and the like can provide multiple edges and walls prone to deformation and/or provide for volume expansion and contraction to increase the strain in the device relative to conventional planar devices. Edges are areas of highest deformation or strain and function as "strain concentrators." It can be appreciated that more edges multiply strain. Strain can also be increased by volume expansion or contraction. For example, strain in a three-dimensional deformable structure having a hemispheric shape will predominantly be in the form of volume expansion and contraction as the hemispheric portion of the structure expands or contracts in all directions (e.g., like a balloon) depending on the external pressure applied. Not all geometric shape designs are illustrated in the present disclosure but can be manufactured using the methods disclosed herein and may offer advantages depending on the type of stress-sensitive device and available substrate surface area and subsurface volume. For example, a pyramidal or truncated pyramidal three-dimensional deformable structure with an opening to the substrate surface from the apex end of the structure can reduce the footprint of the device at the substrate surface. Design configurations can take advantage of the ability for any and all edges and sides to deform on any three-dimensional geometric structure when an external pressure is applied.

The aspect ratio of the surface to the subsurface areas is an important design parameter, as is the surface area of the device on the substrate. For example, a truncated pyramidal three-dimensional portion has a rather large deformable area, and a significantly smaller substrate surface area and will provide an increased signal over a conventional two-dimensional device covering the same surface area. Similarly, the response of a three-dimensional deformable structure having a rectangular prism shape can be increased by increasing the aspect ratio of the rectangular prism (i.e., extending the three-dimensional portion deeper into the substrate and reducing the area at the surface). Furthermore, as discussed with respect to FIG. 9, the additional edges provided by three-dimensional structures increases the number of times a serpentine resistor can traverse an edge, which also increases the signal.

Three-dimensional portion 32 is separated from cavity walls 22A-22E by interstitial space 38 (i.e., gap). A distance between cavity walls 22A-22E and three-dimensional portion 32 can typically range from approximately several hundred Angstroms to several thousand microns.

A height of three-dimensional portion 32 can vary depending on a thickness of substrate 12 and depth of cavity 20. The height of three-dimensional portion 32 is generally not limited by manufacturing constraints and allows for improved signal when compared to planar devices of the prior art.

Figure 3:
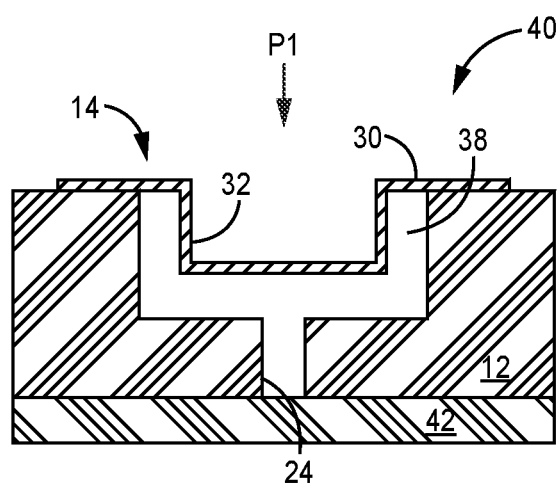
FIG. 3 is a cross-sectional view of an alternative embodiment of the stress-sensitive device of FIG. 1 having an interstitial space between the three-dimensional deformable structure and a cavity in a substrate that is sealed.

FIG. 3. is a cross-sectional view of an alternative embodiment of the stress-sensitive device of FIG. 1 having an interstitial space between the three-dimensional deformable structure and a cavity in substrate that is sealed. FIG. 3 shows stress-sensitive device 40. Stress-sensitive device 40 is substantially similar to stress-sensitive device 10, including substrate 12 and three-dimensional deformable structure 14. In contrast to stress-sensitive device 10, stress-sensitive device 40 includes a second substrate 42, which seals port 24 and interstitial space 38. With port 24 sealed to external pressure, stress-sensitive device 40 can function as an absolute pressure sensor. As such, stress-sensitive device 40 only measures applied external pressure P1.

Substrate 42 can be the same material (e.g., silicon wafer) as substrate 12 and can have the same thickness as substrate 12. It will be understood that all of the figures are provided for illustrative purposes only and are not drawn to scale. Substrate 42 can hermetically seal a pressure in interstitial space 38 thereby allowing stress-sensitive device 40 to function as an absolute pressure sensor to measure an applied external pressure P1. Substrate 42 can be bonded directly to surface 18 of substrate 12 by methods known in the art.

Figure 4:
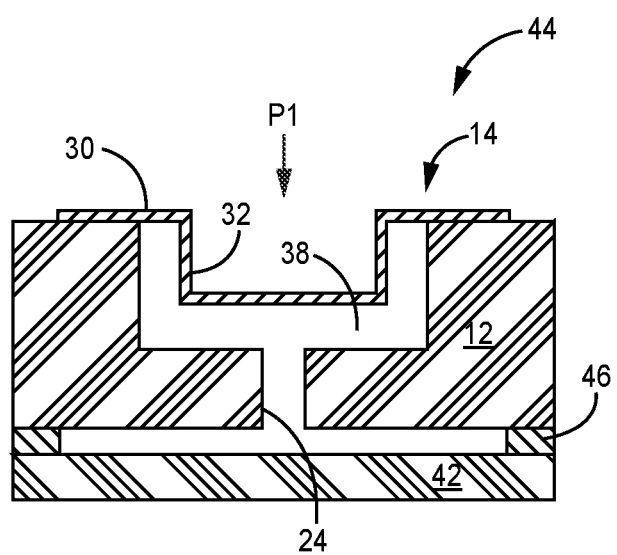
FIG. 4 is a cross-sectional view of an alternative embodiment of the stress-sensitive device of FIG. 3 with a sealed interstitial space.

FIG. 4 is a cross-sectional view of an alternative embodiment of the stress-sensitive device of FIG. 3 with a sealed interstitial space 38. FIG. 4 shows stress-sensitive device 44. Stress-sensitive device 44 includes substrates 12 and 42 and three-dimensional deformable structure 14. Stress-sensitive device 44 also functions as an absolute pressure sensor to measure an applied external pressure P1. In contrast to stress-sensitive device 40, substrate 42 of stress-sensitive device 44 is not directly bonded to substrate 12 but instead bonded around port 24 via glass frit 46 or other bonding agent capable of forming a hermetic seal. Glass frit 46 can be disposed around a perimeter of bottom surface 18 of substrate 12, such that edges of substrates 12 and 42 are sealed. The bonding agent and method of bonding for both stress-sensitive devices 40 and 44 can be selected based on the substrate material or materials. In some embodiments, substrates 12 and 42 can be formed of different materials.

In alternative embodiments, port 24 can remain open to external pressure P2 and a lid or cover (see FIG. 7 and related discussion) can be formed to enclose substrate surface 16 and hermetically seal a pressure between the cover and three-dimensional deformable structure 14. External pressure P2 applied to interstitial space 38 can cause volume expansion or contraction of the variable volume cavity formed by deformable walls 34A-34E.

Figure 5:
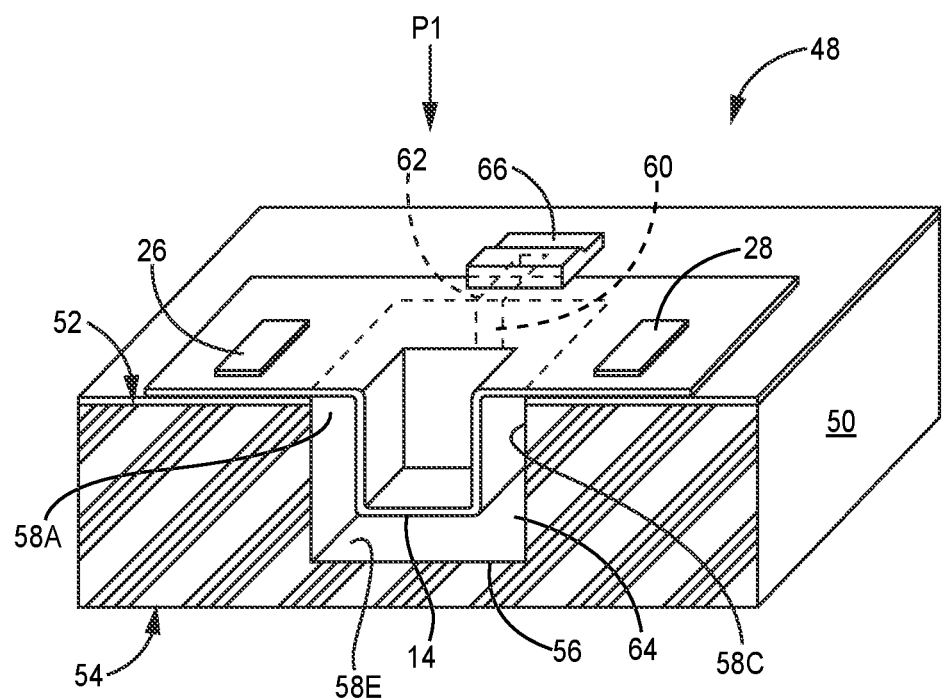
FIG. 5 is a cross-section of an isometric view of another alternative embodiment of a stress-sensitive device with a three-dimensional deformable structure and sealed interstitial space.

FIG. 5 is a cross-section of an isometric view of another alternative embodiment of stress-sensitive device with a three-dimensional deformable structure and sealed interstitial space. Stress-sensitive device 48 is substantially similar to stress-sensitive devices 40 and 44. As illustrated, stress-sensitive device 48 can function as an absolute pressure sensor to measure an applied external pressure P1. FIG. 5 shows stress-sensitive device 48; substrate 50, having oppositely disposed top and bottom surfaces 52 and 54, cavity 56 defined by walls 58A-58E (58D not shown), and port 60, including trench portion 62; three-dimensional deformable structure 14 as described with respect to FIGS. 1-4; interstitial space 64; and seal 66. In contrast to stress-sensitive devices 40 and 44, interstitial space 64 of stress-sensitive device 48 is sealed at top surface 52 of substrate 50 adjacent to planar portion 30 of three-dimensional deformable structure 14.

Cavity 56 is substantially similar to cavity 20 of stress-sensitive devices 10, 40, and 44 with the exception that bottom wall 58E is solid (i.e., is not open to port 24). In contrast, port 60 of stress-sensitive device 48 opens to a side wall of cavity 56, e.g., side wall 56B.

Port 60 is defined by trench portion 62, formed in top surface 52 of substrate 50 and extending to cavity 56. Like port 24, port 60, including trench portion 62, provides access to a sacrificial layer formed between cavity walls 58A-58E and three-dimensional deformable structure 14, which is removed to form interstitial space 64. Port 24 can be formed by known etching techniques. Port 60 can have any known shape limited only by manufacturing techniques. Generally, a cross-sectional area of port 60 can be limited to that needed for removal of a sacrificial layer.

Port 60 can be sealed at substrate surface 52 with seal 66. Seal 66 can be formed of any known material capable of being bonded to substrate 50 and forming a hermetic seal of interstitial space 64. For example, seal 66 can include glass frit or deposited films comprising oxide, nitride, or polysilicon. Seal 66 can be disposed on substrate surface 52 as illustrated in FIG. 5 to cover an opening of trench portion 62. In some embodiments, a sealing material can fill all or a portion of trench portion 62. In some embodiments, port 60 can be left open allowing for sealing with a top cap or during packaging as illustrated, for example, in FIG. 7.

Interstitial space 64 is substantially the same as interstitial space 38 of stress-sensitive devices 40 and 44 with the exception that interstitial space 64 is sealed at a different location in cavity 56 (e.g., cavity wall 58B). Interstitial space 64 can be sealed at a known pressure.

Figure 6:
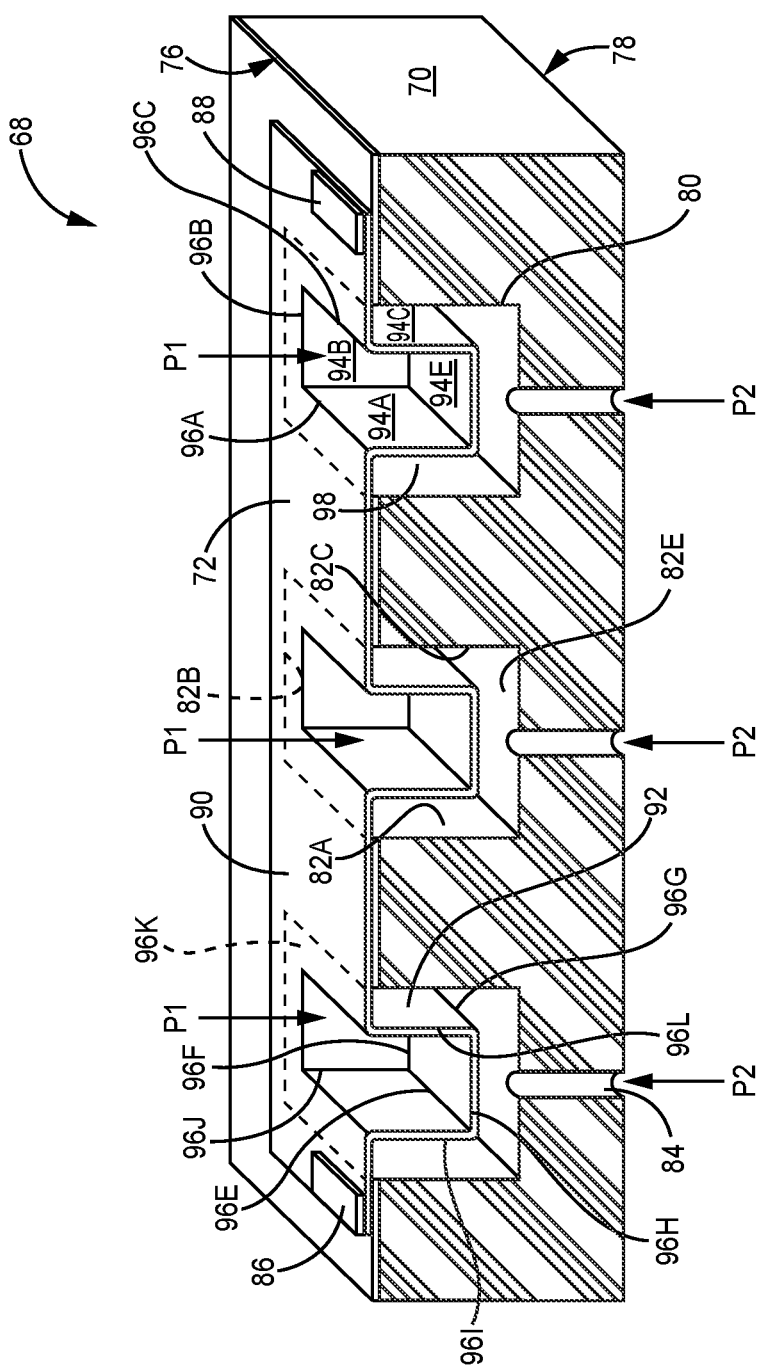
FIG. 6 is a cross-sectional view of a stress-sensitive device with an array of three-dimensional deformable structures.

FIG. 6 is a cross-sectional view of a stress-sensitive device with an array of three-dimensional deformable structures. FIG. 6 shows stress-sensitive device 68, substrate 70, and three-dimensional deformable structure 72. Substrate 70 includes oppositely disposed top and bottom surfaces 76 and 78, cavities 80 defined by cavity walls 82A-82E, and ports 84. Three-dimensional deformable structure 72 includes input pad 86, output pad 88, planar portion 90, and three-dimensional portions 92 defined by deformable walls 94A-94E and deformable edges 96A-96L. Interstitial spaces 98 are formed between three-dimensional portions 92 and cavity walls 82A-82E. Stress-sensitive device 68 is substantially similar to stress-sensitive device 10 as described with respect to FIGS. 1 and 2 provided as an array to increase an output signal of the device. As illustrated, stress-sensitive device 68 can function as a gauge or differential pressure sensor with external pressures P1 and P2 applied to both sides of three-dimensional deformable structure 72.

Substrate 70 is substantially similar to substrate 12 of stress-sensitive device 10 as described with respect to FIGS. 1 and 2 with the exception that substrate 70 has three cavities 80 disposed in a linear arrangement. Each cavity 80 is configured to receive a three-dimensional portion 92 of three-dimensional deformable structure 72.

Ports 84 and interstitial spaces 98 can be substantially the same as port 24 and interstitial space 38 of stress-sensitive device 10 as described with respect to FIGS. 1 and 2. In alternative embodiments, ports 84 can be covered to form a hermetic seal of interstitial spaces 98 like stress-sensitive devices 40 and 44 as described with respect to FIGS. 3 and 4, to form an absolute pressure sensor capable of producing an increased output signal.

Three-dimensional deformable structure 72 can be substantially similar to three-dimensional deformable structure 14 of stress-sensitive devices 10, 40, and 44 with the exception that three-dimensional deformable structure 72 includes multiple three-dimensional portions 92 disposed in a linear arrangement separating input and output pads 86 and 88. Planar portion 90 is positioned in substantially the same manner as planar portion 30 in three-dimensional deformable structure 14, fully surrounding and connected to each three-dimensional portion 92 and covering cavities 80. In alternative embodiments, planar portion 30 can include strips extending only between adjacent cavities and on either side of end cavities such that planar portion 30 does not cover the full perimeters of cavities 80.

External pressures P1 and P2 can be applied to opposite sides of three-dimensional deformable structure 72. External pressure P2 can be applied to interstitial spaces 98 via ports 84. External pressure P1 can be applied to planar portion 30 and three-dimensional portions 92 as described with respect to stress-sensitive device 10. Specifically, pressure P1 can be applied to the variable volume cavity defined by deformable walls 94A-94E and open to substrate surface 76. For a piezoresistive pressure sensor, a bias applied across input pad 86 and output pad 88 can be used to measure a change in resistance of the piezoresistive material of three-dimensional deformable structure 72 with the application of external pressures P1 and P2 as described with respect to stress-sensitive device 10. In alternative embodiments, stress-sensitive device 68 can be a capacitive pressure sensor in which a change in electrical capacitance is measured between three-dimensional deformable structure 72 formed of a conductive material and either a conductive material disposed on the cavity walls or cavity walls 82A-82E as previously described.

Stress-sensitive device 68 can have any number of three-dimensional portions 98 disposed in varying arrangements and is not limited to embodiment shown in FIG. 5. In some embodiments, three-dimensional portions 98 can differ in shape and/or volume (e.g., cubic, hemispheric, truncated pyramidal, and the like) to provide differing types of deformation (e.g., volume expansion/contraction vs. flexing of edges and side walls). The multiple three-dimensional portions 98 in stress-sensitive device 68 increases the number of deformable edges/side walls, etc. in a single resistor and formed upon a single substrate. The use of multiple three-dimensional portions 98 can amplify the output signal as may be needed for some applications.

It will be understood by one of ordinary skill in the art that variations in materials, shapes, sizes and arrangements of three-dimensional portions, depths of substrate cavities, locations of ports for application of external pressure, mechanisms for sealing ports, and interstitial space sizes (distance between three-dimensional portion and cavity walls) fall within the scope of the present disclosure. Varying configurations of the substrate and three-dimensional deformable structure can be used to manufacture resistive or capacitive pressure sensors capable of measuring absolute, gauge, or differential pressure.

Figure 7:
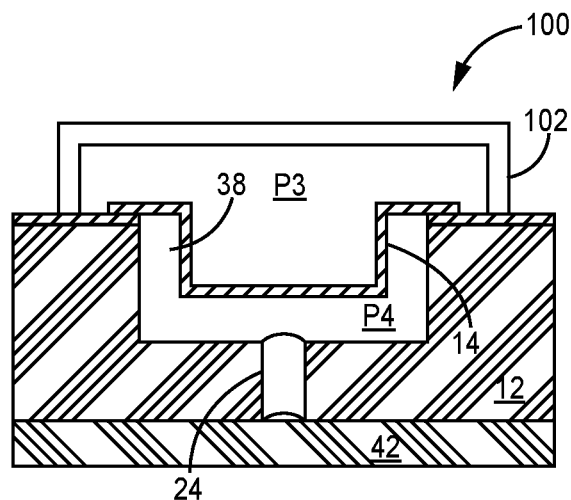
FIG. 7 is a cross-sectional view of yet another stress-sensitive device configured to function as a Physically Unclonable Function (PUF) device.
Figure 8:
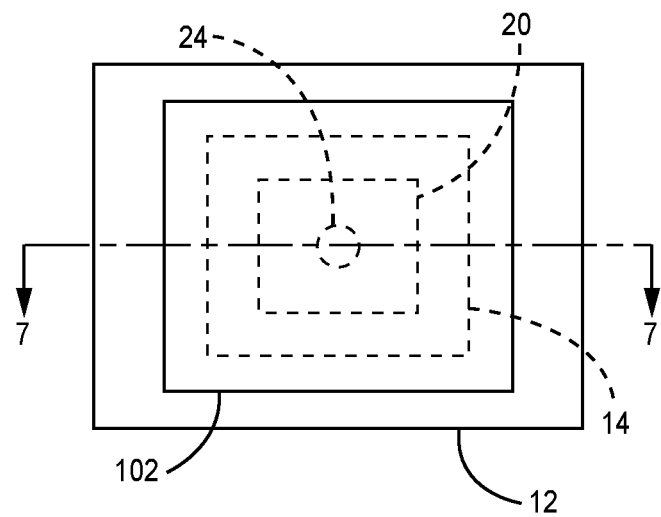
FIG. 8 is a top view of the stress-sensitive device of FIG. 7.

FIG. 7 is a cross-sectional view a stress-sensitive device configured to function as a Physically Unclonable Function (PUF) device. FIG. 8 is a top view of the stress-sensitive device of FIG. 7. FIG. 7 represents a cross-section along section line 7-7, shown in FIG. 8. FIGS. 7 and 8 are described together.

PUFs are commonly implemented in ICs for applications requiring high security and, specifically, cryptography. PUFs are physical objects that typically exploit naturally occurring unique variations in the manufacture of semiconductors. For a given input or set of conditions, a PUF can provide a digital fingerprint or output that serves as a unique identifier. As described herein, a PUF can be used as a unique identifier for a particular sensor or IC or the like as no two PUFs or sets or arrays of PUFs are identical. Any of the stress-sensitive devices disclosed herein can be configured to function as a PUF, including by sealing each side of the three-dimensional deformable structure at a known pressure. A change in pressure on either side of the three-dimensional deformable structure caused by damage to the stress-sensitive device (i.e., seals) can change an output signal of the device, indicating that the device has been tampered with. In some embodiments, the PUF structure can be placed in electrical series with a power supply to the electrical circuit so that if a PUF structure is strained, damaged, or broken, the PUF structure can function as a fuse and effectively disarm the microchip, rendering it useless. PUFs made with the processes and materials (e.g., polysilicon or single crystal silicon) described herein are generally not prone to drift, which allows a unique and unchanging signature for every application. In contrast, prior art PUFs made with a metal electrical trace formed over the deformable portion of the PUF structure or electrical interconnects can be prone to drift due to work hardening of the metal if the metal is subject to continual deformation. While natural variations exist in the manufacture of semiconductors, by decreasing across-wafer uniformity in the films involved in constructing the PUF, the individual PUF structures and PUF arrays can be manufactured to never have the same values by design. PUF structures can be subjected to different pressures and have nonuniform but repeatable electrical performance.

FIG. 7 shows stress-sensitive device 100. Stress-sensitive device 100 is substantially the same as stress-sensitive devices 10 and 40 as described with respects to FIGS. 1-3 but with pressures sealed on both sides of three-dimensional deformable structure 14, illustrated as P3 and P4. Stress-sensitive device 100 additionally includes lid or cover 102 disposed adjacent to substrate top surface 16 to hermetically seal a pressure P3 between cover 102 and three-dimensional deformable structure 14. FIG. 8 shows substrate 12, three-dimensional deformable structure 14 (shown in phantom), and cover 102. As illustrated in FIG. 7, substrate 42 disposed on substrate surface 18 hermetically seals a pressure P4 in interstitial space 38. As previously described with respect to stress-sensitive devices 44 and 48, other sealing mechanisms can be used to seal interstitial space 38. Additionally, the positioning of port 24 or number of ports 24 can be varied as previous discussed. Port 24 in stress-sensitive device 100 is used solely for accessing and removing a sacrificial material disposed between three-dimensional portion 32 and cavity walls 22A-22E to form interstitial space 38, and possibly applying a vacuum or external pressure to set a desired pressure P4 in interstitial space 38 prior to sealing interstitial space 38.

Cover 102 can be bonded directly or indirectly to substrate surface 16 to form a hermetic seal around three-dimensional deformable member 14 and between cover 102 and three-dimensional deformable member 14. Cover 102 can be formed of any material and have any configuration, size, shape suitable for forming a hermetic seal. FIGS. 7 and 8 provide a simplified example of a cover arrangement. Any cover and sealing arrangement known in the art can be provided and can be used to package or enclose multiple devices on substrate surface 16.

Pressures P3 and P4 can be the same or different. Breakage of either seal at interstitial space 38 or between cover 102 and three-dimensional deformable structure 14 will change the pressures P3 and P4 and result in a change in resistance (or capacitance) of three-dimensional deformable structure 14 and output signal, which can be used to determine if the device has been tampered with or to disable a function of the microchip.

Figure 9:
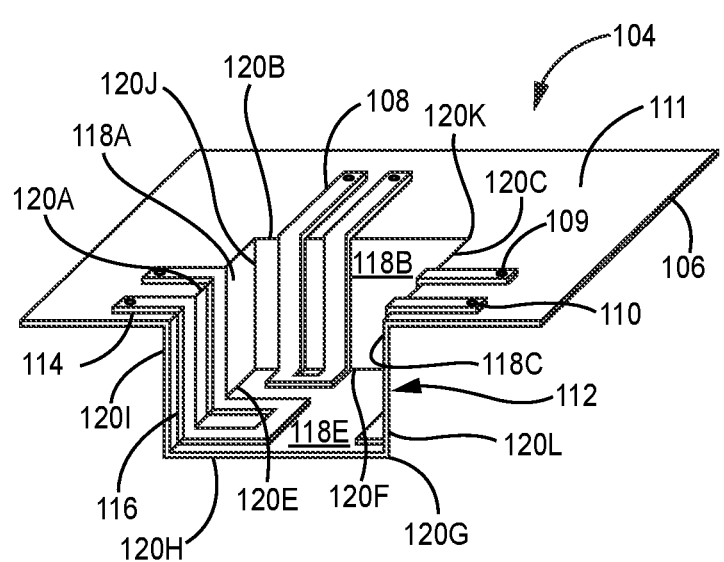
FIG. 9 is a cross-section of an isometric view of yet another embodiment of a stress-sensitive device having multiple resistors disposed on a three-dimensional deformable layer.

FIG. 9 is a cross-section of an isometric view of yet another embodiment of a sensor portion of a stress-sensitive device having multiple three-dimensional deformable structures disposed on a deformable membrane. FIG. 9 shows sensor portion 104 deformable layer 106, three-dimensional deformable structures 108, input pad 109 and output pad 110. Sensor portion 104 can replace the three-dimensional deformable structure in any of the previously disclosed stress-sensitive devices with three-dimensional deformable structures 108 formed of a material having an electrical characteristic responsive to deformation or strain, which can be measured as described with respect to previously disclosed embodiments. Each of the three-dimensional deformable structures 108 can represent, for example, separate resistors, which can be electrically connected in series or parallel and to electrical input and output pads as known in the art.

Deformable layer 106 can be a thin film membrane formed of an insulating material, such as silicon nitride or silicon oxide, or other material capable of deflecting with an applied external pressure. Deformable layer 106 can have any three-dimensional shape as previously disclosed, matching a shape of a substrate cavity in which sensor portion 104 is disposed. Deformable layer 106 has planar portion 111 and three-dimensional portion 112, similar to planar portion 30 and three-dimensional portion 32 of three-dimensional deformable structure 14. Planar portion 111 can be disposed on a substrate surface in a stress-sensitive device. Three-dimensional portion 112 can be disposed in a substrate cavity. Deformable layer 106 can be separated from substrate cavity walls by an interstitial space as previously described with respect to other embodiments disclosed herein, allowing for deflection of deformable layer 106 toward and/or away from substrate cavity walls.

Three-dimensional deformable structures 108 can be formed of a piezoresistive material such as polysilicon and can be disposed directly on deformable layer 106. Similar to three-dimensional deformable structure 14, three-dimensional deformable structures 108 can include planar portions 114 disposed across a substrate surface and three-dimensional portions 116, which extend into a substrate cavity. Any number of three-dimensional structures 108 can be provided on deformable layer 106 and can be disposed in any arrangement to optimize an output signal. Generally, three-dimensional structures 108 can be disposed on surfaces of deformable layer 106 that experience the greatest strain or deformation with an applied external pressure to advantageously increase an output signal of the stress-sensitive device. For example, as illustrated in FIG. 9, three-dimensional portion 112 has a cubic or rectangular prism geometric shape with side walls 118A-118D and bottom wall 118E and edges 120A-120L. Each three-dimensional deformable structure 108 can be disposed across a center region of an edge 120A-120D connecting planar portion 110 to three-dimensional portion 112, across a center region of side walls 118A-118D, and across center region of an edge 120E-120H connecting side walls 118A-118D to bottom wall 118E, as the center regions of these edges and walls will experience the greatest deformation or strain.

As illustrated in FIG. 9, three-dimensional deformable structures 108 extend partially across bottom wall 118E and remain separated from each other (i.e., do not overlap). Three-dimensional deformable structures 108 may have a U-shaped geometry with a bottom portion of the U shape disposed on bottom wall 118E. In alternative embodiments, three-dimensional structures can have serpentine shapes with multiple convolutions disposed across a single top edge (e.g., 120A) and single bottom edge (e.g., 120E) of deformable layer 106 or can be disposed in a spiral shape that extends across edges 1201-120L. In other embodiments, one or more three-dimensional deformable structures can be patterned to traverse across deformable layer 106 by extending down one side wall, across bottom wall 118E, and up the opposite side wall. For example, in some embodiments, a single three-dimensional deformable structure 108 can be disposed on deformable layer 106 with oppositely disposed ends on planar portion 110 to connect to input and output pads. In other embodiments, a single three-dimensional deformable structure can be patterned to fully traverse one or more edges. The shape and arrangement of one or more three-dimensional deformable structures 108 is limited only by available manufacturing techniques (e.g., masking and deposition constraints). Each three-dimensional deformable structure 108 can be designed to extend across multiple edges 120A-120L and multiple walls 118A-118E and any number of three-dimensional deformable structures 108, including a single three-dimensional deformable structure 108, can be designed to extend across each edge 120A-120L and wall 118A-118E without fully covering each edge 120A-120L and each wall 118A-118E. Three-dimensional deformable structures 108 can advantageously be patterned in any manner to provide multiple resistors, resistor bridges, or electrical interconnects.

FIGS. 10, 11, 12, and 14 are flow charts of methods for forming different embodiments of a three-dimensional stress-sensitive device. The general methods for manufacture can be the same for each of the disclosed embodiment with variations and/or additional steps to produce different types of stress-sensitive devices and different subsurface geometries and configurations. The disclosed methods can include any processing steps or methods of manufacture known in the art for producing IC and MEMS devices. The disclosed methods use planar processing techniques. The methods of manufacture can be selected based on the processing constraints of the host IC or MEMS device (i.e., device on which the three-dimensional stress-sensitive device is provided). Processing steps of the three-dimensional stress-sensitive device can be performed in addition to or simultaneously with processing steps needed to form other devices or features on the host IC or MEMS device. It will be understood by one of ordinary skill in the art that the embodiments disclosed are merely examples of stress-sensitive devices that can be formed using the disclosed method and that variations thereof fall within the scope fall within the scope of the present disclosure. While specific embodiments are designed as absolute pressure sensors, gauge or differential pressure sensors, or PUF, it will be understood by one of ordinary skill in the art that the type of stress-sensitive device can be modified by providing or not providing seals on either side of a three-dimensional deformable structure to seal a pressure or to provide for application of an external pressure, respectively. Furthermore, any of the stress-sensitive device configurations disclosed herein can be provided in an array to amplify an output signal and can be combined in any combination and arrangement.

Figure 10:
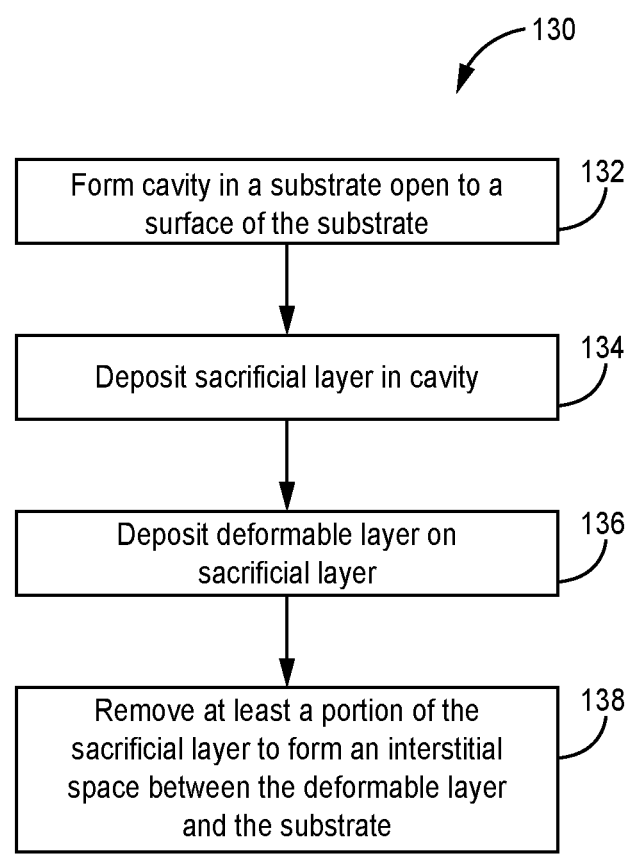
FIG. 10 is a flow chart of a method for forming a three-dimensional stress-sensitive device.

FIG. 10 is a flow chart of a general method 130 for forming a three-dimensional stress-sensitive device of the types disclosed herein. In step 132, one or more cavities is formed in a substrate. The cavity can be a depression defined in a surface of the substrate and can extend a partial thickness of the substrate. In some embodiments described further herein, the cavity can be a lateral subsurface cavity open to a surface of the substrate via a port having a cross-sectional area smaller than a cross-sectional area of the subsurface cavity. The cavity can be formed using known methods including isotropic and anisotropic etching, depending on the area constraints of the host device or processing steps already included in processing the host device. Techniques can include both wet and dry etches. In some embodiments, a lateral subsurface cavity can be formed using selective lateral etching through surface holes.

In step 134, a sacrificial layer can be deposited in the cavity. The sacrificial layer can be a conformal layer that lines the walls of the cavity. The sacrificial layer can be an oxide, such as silicon oxide, or other material that can be subsequently removed. The sacrificial layer can be deposited using known deposition methods or can be thermally grown as known in the art.

In step 136, a deformable layer can be deposited on the sacrificial layer in the cavity and across a portion of a surface of the substrate. The deformable layer can be a piezoresistive material such as a doped or intrinsic polysilicon. In alternative embodiments, an insulating layer such as silicon oxide or nitride can be deposited on the sacrificial layer and a piezoresistive material can be patterned on the insulating layer as described with respect to sensor portion 104 of FIG. 9. The deformable layer forms the three-dimensional deformable structures of the previously described stress-sensitive devices. The deformable layer can be deposited using known deposition and masking techniques. In some embodiments, the deformable layer can be a conductive material provided to form a first capacitive plate. In such embodiments, a conductive material can be deposited on the walls of the cavity prior to deposition or growth of the sacrificial layer to form a second capacitive plate, or cavity walls can be doped to form the second capacitive plate.

In some embodiments, holes used to form a subsurface cavity can be plugged or sealed with the deposition of the deformable layer, e.g., polysilicon can be deposited in the holes.

In step 138, the sacrificial layer is removed from the cavity walls to create an interstitial space between the deformable layer and the cavity walls. The sacrificial layer can be removed using known etching techniques. For example, hydrofluoric acid can be used to preferentially etch a silicon oxide sacrificial layer. The sacrificial layer can be removed through one or more ports extending from a surface of the substrate and opening to the cavity as previously described. Release of the deformable layer is not susceptible to striction because the three-dimensional deformable layer is sufficiently rigid and has equal forces applied on all surfaces which can counteract the forces applied during processing including surface tension.

In some embodiments, ports can be sealed during processing as opposed to during packaging to provide better control of an interstitial space pressure. In some embodiments, ports can be sealed with organics such as polyimide and parylene, which can be photo patternable or non-photo patternable. In some embodiments, ports can be sealed with a layer of oxide, glass frit, or similar insulating film. In some embodiments, ports can be sealed with a physical structure such as a second substrate or other capping mechanism as disclosed with respect the stress-sensitive devices of FIGS. 3-5.

In some embodiments, a conformal insulating layer comprising, for example, silicon nitride can be deposited directly on the surface of the substrate and cavity walls prior to deposition or growth of the sacrificial layer. The insulating layer can be used to mask the substrate during removal of the sacrificial layer. In some embodiments a conformal conductive and/or dielectric material can be deposited to line the cavity walls, either directly on the substrate or on the insulating layer, prior to deposition or growth of the sacrificial layer. The conductive or dielectric material layer can be used for capacitive pressure sensor devices as previously described.

Figure 11:
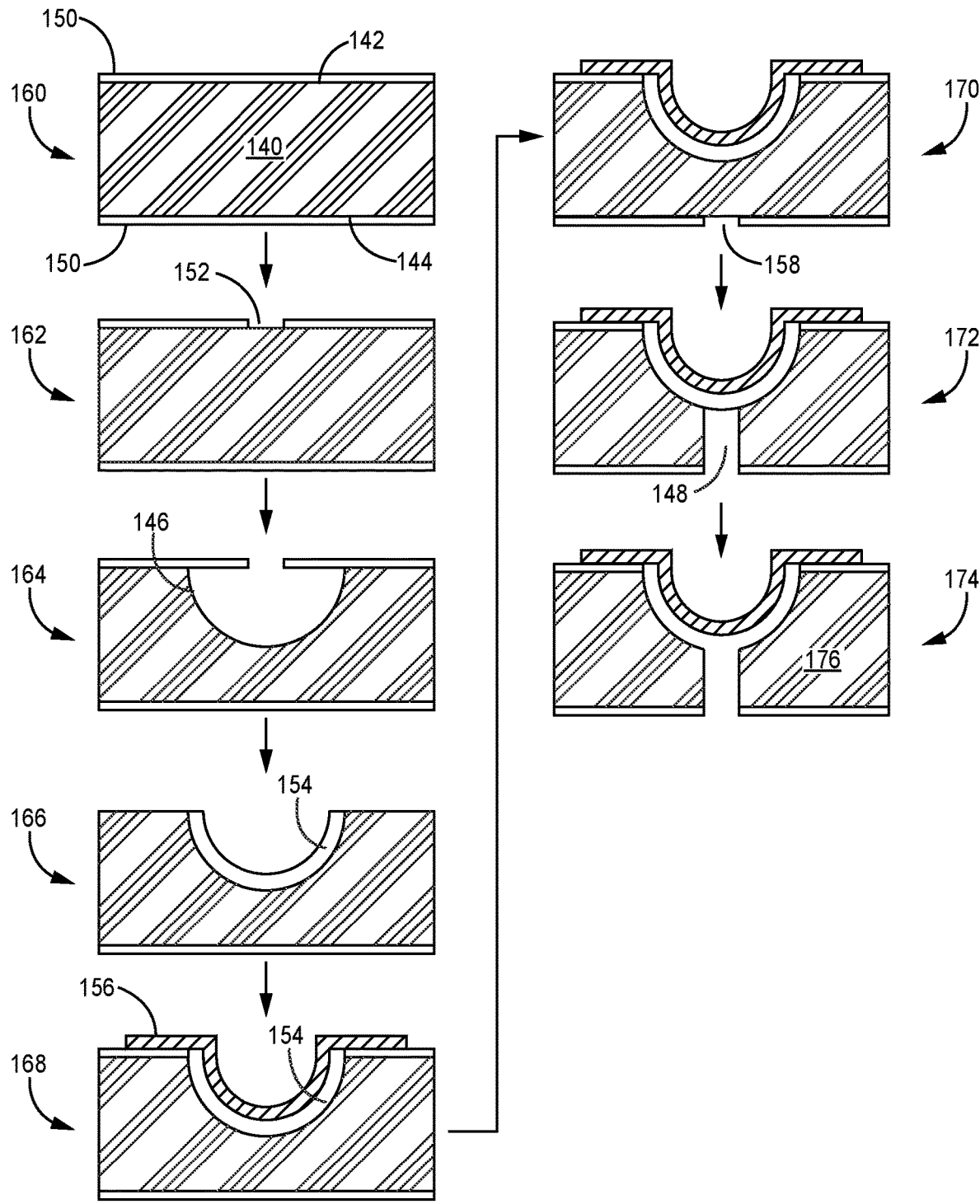
FIG. 11 is flow chart including cross-sectional views of steps of a method for forming one embodiment of a three-dimensional stress-sensitive device.

FIG. 11 is flow chart including cross-sectional views of steps of a method for forming one embodiment of a three-dimensional stress-sensitive device. FIG. 11 shows substrate 140 having oppositely disposed top and bottom surfaces 142 and 144, cavity 146, and port 148, masking material 150, window 152, sacrificial layer 154, three-dimensional deformable structure 156, window 158, multiple processing steps, and resulting three-dimensional stress-sensitive device 176. Three-dimensional stress-sensitive device 176 is substantially similar to stress-sensitive device 10 as described with respect to FIGS. 1 and 2 with the exception that cavity 150 and three-dimensional deformable structure 154 have a hemispheric shape. Port 148 can be substantially the same as port 24 of stress-sensitive device 10, provided from substrate surface 144 and opening to a bottom wall of cavity 150. As previously described, strain in the hemispheric shape of three-dimensional deformable structure 156 is predominantly defined by deformation around a circumferential edge and volume expansion or contraction of the three-dimensional portion of the deformable structure 156.

In step 160, masking material 150 is applied to both top and bottom substrate surfaces 142 and 144. The masking material can be, for example, silicon nitride as known in the art. In step 162, window 152 is formed in masking material 150 at top substrate surface 142 using a known etching process. Window 152 is centrally located above a desired location for cavity 146. In step 164, a hemispheric cavity 146 is formed via isotropic etching. In step 166, masking material 150 overhanging cavity 146 is removed and sacrificial layer 154 (e.g., silicon oxide) is deposited or thermally grown in cavity 146. Sacrificial layer 154 conforms to the surface of cavity 146 and lines the walls of cavity 146. In step 168, three-dimensional deformable structure 154 is formed by depositing, for example, a piezoresistive film such as polysilicon, on a portion of top substrate surface 142 and in cavity 146. The piezoresistive film is conformal and lines the walls of cavity 146. In step 170, window 158 is formed in masking material 150 on bottom substrate surface 144 via known etching processes. Window 158 can be centrally located below a base of cavity 146 and can have a cross-sectional area smaller than a cross-sectional area of cavity 146. In step 172, port 148 is etched in substrate 140 via window 158. Port 148 extends to sacrificial layer 154 and can have the same cross-sectional area as window 158. In step 174, sacrificial layer 154 is removed from cavity 146 via etching to form three-dimensional stress-sensitive device 176 with three-dimensional deformable structure 156 suspended in cavity 146 and separated from cavity walls by an interstitial space as previously disclosed.

Figure 12:
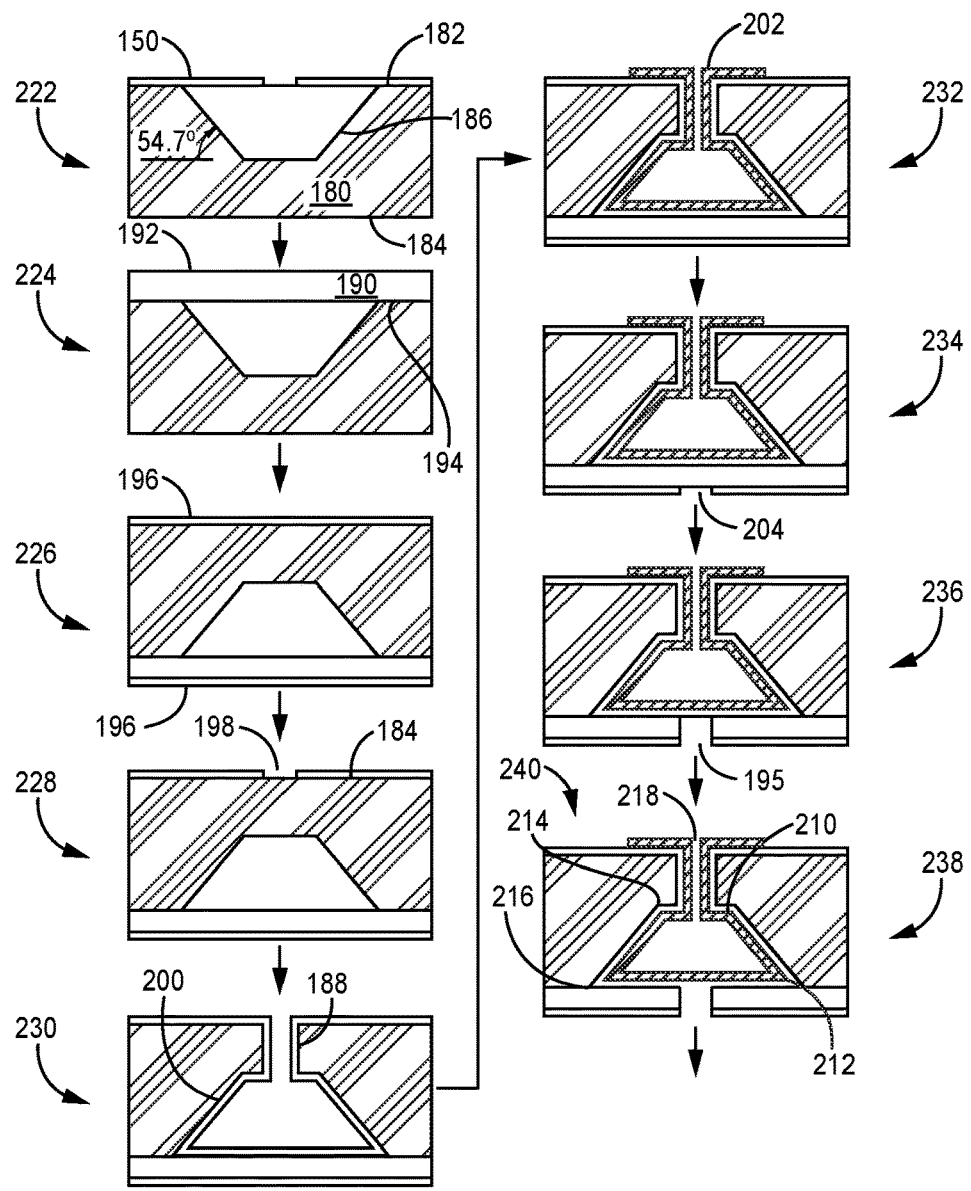
FIG. 12 is a flow chart including cross-sectional views of steps of a method for forming another embodiment of a three-dimensional stress-sensitive device.
Figure 13:
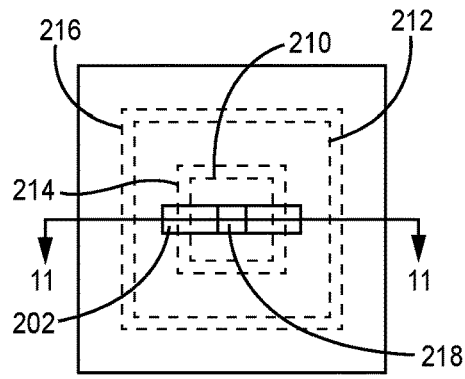
FIG. 13 is top view of the three-dimensional stress-sensitive device of FIG. 12.

FIG. 12 is a flow chart including cross-sectional view of steps of a method for forming another embodiment of a three-dimensional stress-sensitive device. FIG. 13 is top view of the three-dimensional stress-sensitive device formed by the method of FIG. 12. FIG. 12 shows substrate 180 having oppositely disposed surfaces 182 and 184, cavity 186, and port 188, second substrate 190 having oppositely disposed surfaces 192 and 194 and port 195, masking material 196, window 198, sacrificial layer 200, three-dimensional deformable structure 202, window 204, top and bottom portions 210 and 212 of deformable structure 202 in cavity 186, top and bottom edges 214 and 216 of cavity 186, pressure port 218, multiple processing steps, and resulting three-dimensional stress-sensitive device 240. FIG. 13 shows top substrate surface 182, three-dimensional deformable structure 202, pressure port 218, top and bottom portions 210 and 212 (shown in phantom) of deformable structure 202 in cavity 186, top and bottom edges 214 and 216 (shown in phantom) of cavity 186.

Three-dimensional stress-sensitive device 240 is substantially similar to stress-sensitive device 10 as described with respect to FIGS. 1 and 2 with the exception that cavity 186 and three-dimensional deformable structure 202 have a truncated pyramidal shape and a cross-sectional area of an opening to cavity 186 at substrate surface 184 is smaller than a subsurface cross-sectional area of cavity 186. The truncated pyramidal shaped three-dimensional deformable structure provides multiple deformable edges and walls responsive to an applied external pressure as well as volume expansion and contraction in the subsurface of substrate 180, while minimizing a footprint of the device at substrate surface 184. The reduced footprint at substrate surface 184 frees space for additional IC or MEMS components.

Processing of three-dimensional deformable structure 202 includes steps 160 and 162 (applying masking material and patterning a window in the masking material) as described with respect to FIG. 11 but not shown in FIG. 12.

In step 222, truncated pyramidal cavity 186 is formed via anisotropic etching. As illustrated, walls of truncated pyramidal cavity 186 are disposed at angles of 54.7 degrees. In step 224, overhanging masking material 196 is removed and second substrate 190 is arranged to enclose cavity 186. As illustrated, surface 196 of second substrate 190 is positioned on surface 182 of substrate 180. Substrates 180 and 190 can be bonded by any known means and as previous described to seal what will become a bottom portion of cavity 186. In step 226, the intermediate device is inverted and masking material 196 is deposited on surface 184 of substrate 180 and surface 194 of substrate 190. In step 228, window 198 is etched in masking material 196 at surface 184. Window 198 can be centrally located above a top portion of truncated pyramidal cavity 186 and can have a cross-sectional area smaller than a cross-sectional area of the top portion of truncated pyramidal cavity 186. In step 230, port 188 is etched in substrate 180 via window 198 and sacrificial layer 200 (e.g., silicon oxide) is deposited or thermally grown in cavity 186 and on walls of port 188. Port 188 extends from substrate surface 184 to cavity 186 such that port opens and provides access to cavity 186 from substrate surface 184. Prior to addition of sacrificial layer 200, port 188 can have a cross-sectional area matching a cross-sectional area of window 198. Sacrificial layer 200 conforms to the surfaces of cavity 186 and lines the walls of cavity 186 and port 188. In step 232, three-dimensional deformable structure 202 is formed by depositing, for example, a piezoresistive film such as polysilicon, on a portion of substrate surface 184 and on sacrificial layer 200 in port 188 and cavity 186. The piezoresistive film is conformal and lines the walls of cavity 186 and port 188 (over sacrificial layer 200). As illustrated in FIG. 13, the piezoresistive film can be patterned to form two strips on either side of pressure port 218, which can be connected to electrical input and output pads, respectively. In step 234, window 204 is formed in masking material 196 on surface 194 of substate 190 via known etching processes. Window 204 can be centrally located below a base of cavity 186 and can have a cross-sectional area smaller than the base of cavity 186. In step 236, port 195 is etched in substrate 190. Port 195 extends from surface 192 to sacrificial layer 200. Port 195 can have a cross-sectional area matching the cross-sectional area of window 204. In step 238, sacrificial layer 200 is removed from cavity 186 via etching to form three-dimensional stress-sensitive device 240 with pressure ports 195 and 218 with three-dimensional deformable structure 202 suspended in cavity 286 and separated from cavity walls by an interstitial space as previously disclosed.

Figure 14:
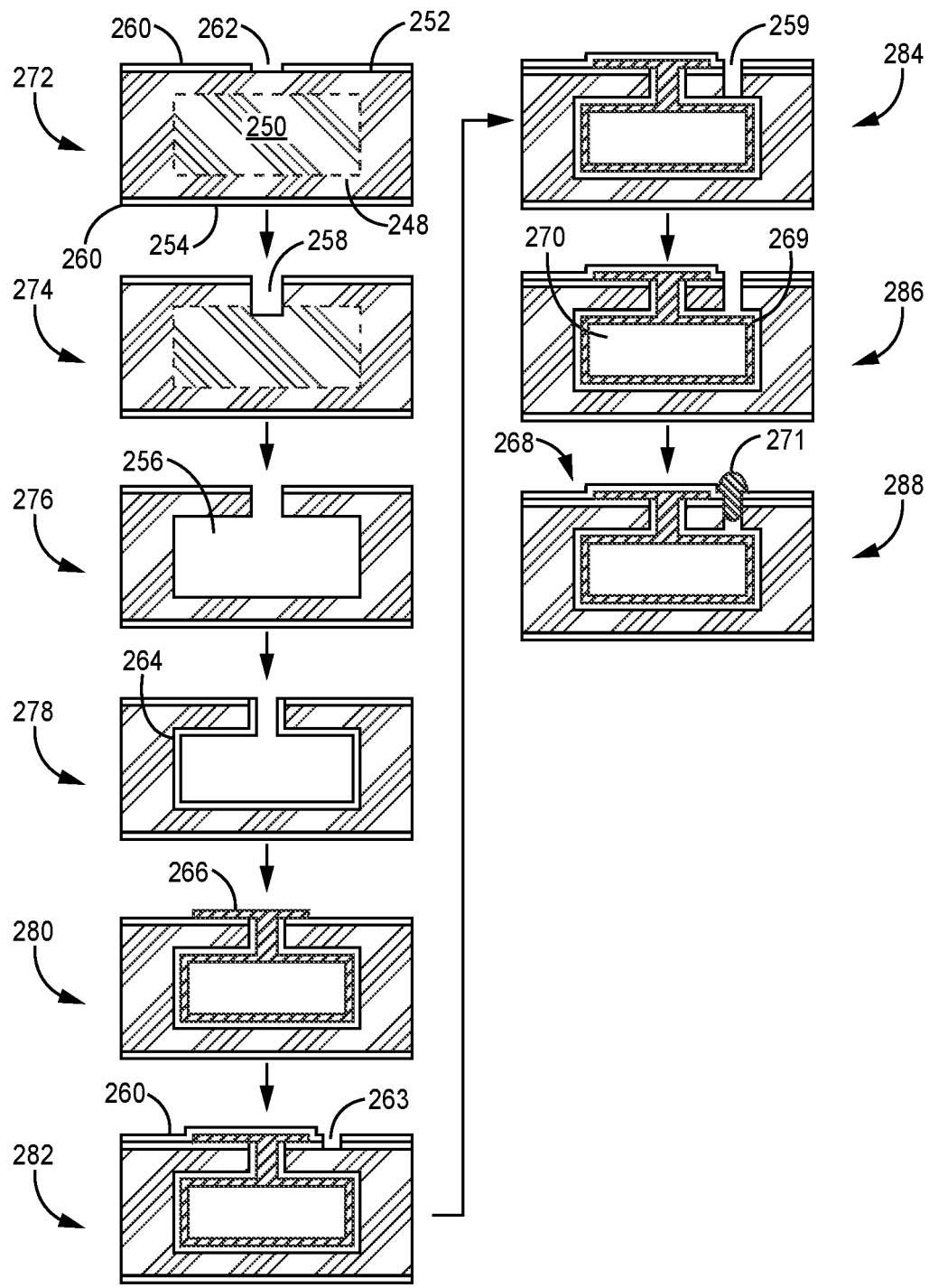
FIG. 14 is a flow chart including cross-sectional views of steps of a method for forming yet another embodiment of a three-dimensional stress-sensitive device.

FIG. 14 is a flow chart including cross-sectional views of steps of a method for forming yet another embodiment of a three-dimensional stress-sensitive device. FIG. 14 shows substrate 248 having highly doped subsurface layer 250, oppositely disposed top and bottom surfaces 252 and 254, subsurface cavity 256, and ports 258 and 259, masking material 260, window 262, sacrificial layer 264, three-dimensional deformable structure 266, interstitial space 269, multiple processing steps, and resulting three-dimensional stress-sensitive device 270. The materials of three-dimensional stress-sensitive device 270 can be substantially similar to materials used to form stress-sensitive device 10 as described with respect to FIG. 1 with the exception that substrate 248 can be formed with a highly doped subsurface layer in a desired location of cavity 256 to allow for preferential or selective etching. The highly doped subsurface layer can be formed using doping methods known in the art. Three-dimensional stress-sensitive device 270 is configured as a PUF device with cavity 256 and interstitial space 269 sealed to external pressures. In contrast to PUF device 100 described with respect to FIG. 7, both cavity 256 and interstitial space 269 are sealed at top substrate surface 252. Further, cavity 256 is sealed by three-dimensional deformable structure 266.

In step 272, masking material 260 is deposited on top and bottom substrate surfaces 252 and 254 and patterned on top substrate surface 252 to provide window 262 as described with respect to previously disclosed methods. In step 274, port 258 is etched from window 262 into doped subsurface layer 250. Port 258 can have a cross-sectional area matching a cross-sectional area of window 262 and smaller than a cross-sectional area of doped subsurface layer 250. The cross-sectional area of port 258 is defined to accommodate a desired thickness of sacrificial material 264 and piezoresistive material (deposited to form three-dimensional deformable structure 266) such that the piezoresistive material fills or seals port 258 during deposition after achieving a desired material thickness in subsurface cavity 248. In step 276, doped subsurface layer 250 is removed via selective etching to form cavity 256. As illustrated in FIG. 14, cavity 256 is a lateral subsurface cavity having a rectangular box shape. In step 278, sacrificial layer 264 (e.g., silicon oxide) is deposited or thermally grown on walls of subsurface cavity 256 and port 258. In step 280, three-dimensional deformable structure 266 is formed by depositing, for example, a piezoresistive film such as polysilicon, on a portion of top substrate surface 252 and on sacrificial layer 264 in port 258 and subsurface cavity 256. The piezoresistive film is conformal and lines the walls of subsurface cavity 256 and port 258 (over sacrificial layer 252). A thickness of the piezoresistive film is defined to provide a desired material thickness in subsurface cavity 256 and to hermetically seal port 258 during deposition thereby forming sealed subsurface cavity 270. In step 282, masking material 260 is patterned over substrate surface 252 including a planar portion of three-dimensional deformable structure 266 to provide window 263 adjacent to an edge of three-dimensional deformable structure 266 and above subsurface cavity 256. In step 284, port 259 is etched from window 263 to sacrificial layer 264. In step 286, sacrificial layer 264 is removed via etching forming interstitial space 269 between three-dimensional deformable structure 266 and the walls of subsurface cavity 248 and port 258. In step 288, port 259 is hermetically sealed with a sealing material 271 as described with respect to port 24 of stress-sensitive device 100.

It will be understood by one of ordinary skill in the art that any of the disclosed methods can include additional processing steps and/or the deposition of additional material layers as known in the art for the manufacture of IC and MEMS devices and that the methods and resulting stress-sensitive device structures disclosed are not limited to the steps, materials, and structures illustrated and described herein. Furthermore, any of the disclosed embodiments or features of the disclosed embodiments can be combined to form varying three-dimensional stress-sensitive devices including stress-sensitive devices including arrays of three-dimensional deformable structures.

The three-dimensional deformable structures disclosed herein provide multiple edges and/or multiple surfaces that may deform or flex under an applied pressure. As such, a stress-sensitive material can experience more deformation (strain) than a two-dimensional structure of the prior art and can thereby provide a larger output signal compared to a planar, two-dimensional, device for any given applied pressure. As disclosed herein, some embodiments of the three-dimensional structure can provide an improved signal strength for a reduced substrate surface area as compared to prior art devices thereby allowing for more devices to be produced on a single substrate. Because the three-dimensional stress-sensitive device can be suspended from a surface of the substrate and extend into a subsurface cavity or depression, the devices may be less sensitive to external stresses, such as those applied to the device from packaging, processing, and handling, and can allow freedom in selecting die attach methods, which can reduce the complexity of packaging. Three-dimensional stress-sensitive structures can be suitable for the manufacture of piezoresistive pressure sensors, capacitance pressure sensors, and PUF devices.

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, electrical, rotational or vibrational operational conditions, and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

Discussion of Possible Embodiments

The following are non-exclusive descriptions of possible embodiments of the present invention.

A stress-sensitive device includes a substrate having a first surface with a cavity defined therein and a three-dimensional deformable material extending along the first surface and into the cavity. The three-dimensional deformable material has an electrical characteristic responsive to deformation.

The stress-sensitive device of the preceding paragraph can optionally include, additionally and/or alternatively, any one or more of the following features, configurations and/or additional components:

The stress-sensitive device of the preceding paragraphs, wherein the three-dimensional deformable material includes a first portion positioned along the first surface of the substrate, wherein the first portion has a planar geometry, and a second portion extending from the first portion into the cavity, wherein the second portion is connected to the first portion by a first edge.

The stress-sensitive device of any of the preceding paragraphs, wherein second portion is separated from a wall of the cavity by an interstitial space.

The stress-sensitive device of any of the preceding paragraphs, wherein the second portion includes a plurality of walls and wherein at least two of the plurality of wall are connected by a second edge.

The stress-sensitive device of any of the preceding paragraphs, wherein the three-dimensional deformable material is one of a piezoresistive material and a conductive material.

The stress-sensitive device of any of the preceding paragraphs, wherein the second portion has a geometry selected from a group consisting of a cube, rectangular prism, pyramid, truncated pyramid, and cylinder.

The stress-sensitive device of any of the preceding paragraphs, wherein the cavity has a geometry substantially matching a geometry of the second portion.

The stress-sensitive device of any of the preceding paragraphs, wherein the first portion extends fully around an opening to the cavity on the first surface of the substrate.

The stress-sensitive device of any of the preceding paragraphs, wherein the three-dimensional deformable material is a first three-dimensional deformable material and wherein the first portion is positioned across only a portion of an edge of the cavity and the second portion covers only a portion of the wall of the cavity.

The stress-sensitive device of any of the preceding paragraphs, and further comprising a second three-dimensional deformable material, wherein the first and second three-dimensional deformable materials are disposed on a deformable layer and wherein the second portion of the first three-dimensional deformable material is spaced apart from the second portion of the second three-dimensional deformable material.

The stress-sensitive device of any of the preceding paragraphs, and further comprising a port extending through the substrate and opening to the interstitial space.

The stress-sensitive device of any of the preceding paragraphs, wherein a cavity opposite the interstitial space and defined at least in part by the three-dimensional portion is sealed.

The stress-sensitive device of any of the preceding paragraphs, and further comprising an insulating layer disposed on the first surface of the substrate and lining the cavity, wherein the second portion is spaced from the insulating layer.

The stress-sensitive device of any of the preceding paragraphs, wherein the three-dimensional deformable structure is a piezoresistive material or a conductive material and wherein the stress-sensitive device is configured to measure a change in strain or capacitance of the three-dimensional deformable structure.

A method of forming a three-dimensional stress-sensitive device includes providing a substrate having a first surface and a second surface opposite the first surface, forming a cavity in the substrate, wherein the cavity is open to the first surface, depositing a sacrificial layer in the cavity, depositing a deformable material on the sacrificial layer, and removing at least a portion of the sacrificial layer to form an interstitial space between the deformable material and the substrate in the cavity.

The method of the preceding paragraph can optionally include, additionally and/or alternatively, any one or more of the following features, configurations, additional components, and/or steps:

The method of any of the preceding paragraphs and further including depositing an insulting layer on the first surface.

The method of any of the preceding paragraphs and further including forming a hole through the insulating layer and the substrate to provide access to the sacrificial layer and removing the sacrificial layer via chemical etching.

The method of any of the preceding paragraphs and further including sealing the interstitial space.

The method of any of the preceding paragraphs and further including g sealing a cavity opposite the interstitial space and defined at least in part by the deformable material.

The method of any of the preceding paragraphs, wherein the deformable material is one of a piezoresistive material and a conductive material.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A stress-sensitive device comprising:
    a substrate having a first surface with a cavity defined therein; and
    a three-dimensional deformable material extending along the first surface and into the cavity and separated from a wall of the cavity by an interstitial space, the three-dimensional deformable material being deformable in each of three dimensions and comprising:
        a first portion positioned along the first surface of the substrate, wherein the first portion has a planar geometry; and
        a second portion extending from the first portion into the cavity;
        wherein the second portion is connected to the first portion by a first edge;
        wherein the second portion comprises a plurality of walls and wherein at least two of the plurality of walls are connected by a second edge; and
        wherein the second portion and part of the first portion are separated from a wall of the cavity by the interstitial space;
    wherein an electrical characteristic across the stress-sensitive device is responsive to deformation of the three-dimensional deformable material in each of three dimensions.

2. The stress-sensitive device of claim 1, wherein the three-dimensional deformable material is one of a piezoresistive material and a conductive material.

3. The stress-sensitive device of claim 1, wherein the second portion has a geometry selected from a group consisting of a cube, rectangular prism, pyramid, truncated pyramid, and cylinder.

4. The stress-sensitive device of claim 1, wherein the cavity has a geometry substantially matching a geometry of the second portion.

5. The stress-sensitive device of claim 1, wherein the first portion extends fully around an opening to the cavity on the first surface of the substrate.

6. The stress-sensitive device of claim 1, wherein the three-dimensional deformable material is a first three-dimensional deformable material and wherein the first portion is positioned across only a portion of an edge of the cavity and the second portion covers only a portion of the wall of the cavity.

7. The stress-sensitive device of claim 6, and further comprising:
    a second three-dimensional deformable material extending along the first surface and into the cavity, the second three-dimensional deformable material comprising:
        a first portion positioned along the first surface of the substrate, wherein the first portion has a planar geometry; and
        a second portion extending from the first portion into the cavity, wherein the second portion is connected to the first portion by a first edge; and
    a deformable layer;
    wherein the first and second three-dimensional deformable materials are disposed on the deformable layer and wherein the second portion of the first three-dimensional deformable material is spaced apart from the second portion of the second three-dimensional deformable material.

8. The stress-sensitive device of claim 1, further comprising a port extending through the substrate and opening to the interstitial space.

9. The stress-sensitive device of claim 1, wherein a cavity opposite the interstitial space and defined at least in part by the second portion is sealed.

10. The stress-sensitive device of claim 1, further comprising an insulating layer disposed on the first surface of the substrate and lining the cavity, wherein the second portion is spaced from the insulating layer.

11. The stress-sensitive device of claim 1, wherein the three-dimensional deformable structure is a piezoresistive material or a conductive material and wherein the stress-sensitive device is configured to measure a change in deformation or capacitance of the three-dimensional deformable structure.

* * * * *